Jan. 6, 1970 K. A. HUELSMAN 3,488,652
ANALOG TO DIGITAL CONVERTER
Filed Oct. 4, 1966 4 Sheets-Sheet 1

INVENTOR.
KENNETH A. HUELSMAN,
BY [signature]
AGENT.

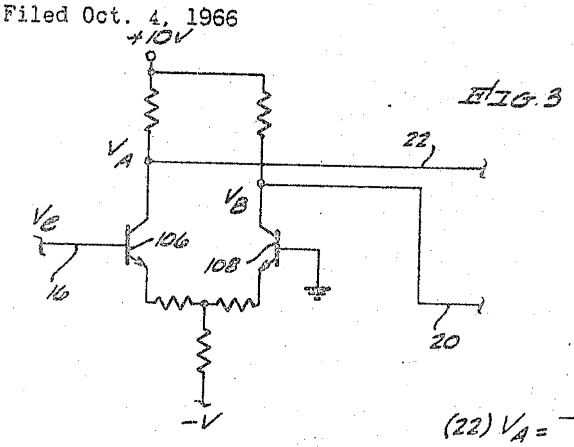
FIG. 3
FIG. 3a.
| | $V_e$ + | $V_e$ - | $V_e$ = 0 |
|---|---|---|---|
| (22) $V_A$ = | +1 | +10 | +5 |
| (20) $V_B$ = | +10 | +1 | +5 |
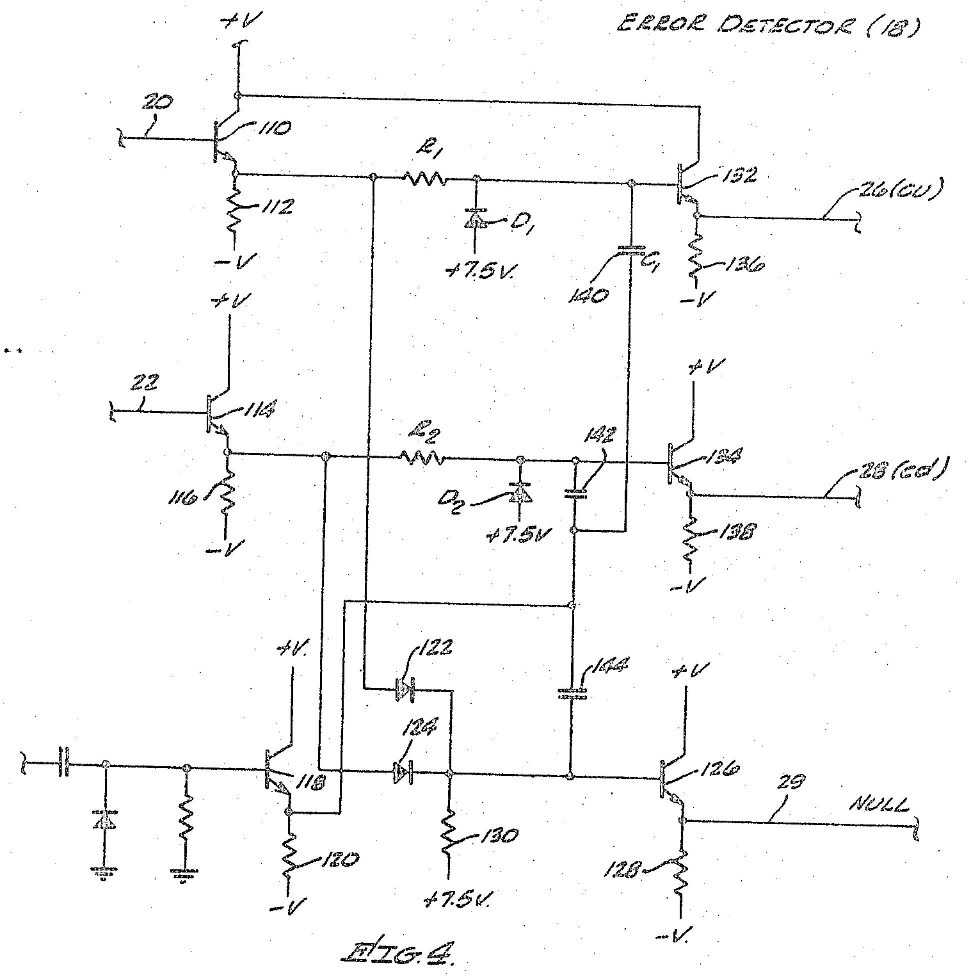
FIG. 4.

3,488,652

ANALOG TO DIGITAL CONVERTER

Kenneth A. Huelsman, Oceanside, Calif., assignor, by mesne assignments, to Weston Instruments, Inc., Newark, N.J., a corporation of Delaware Filed Oct. 4, 1966, Ser. No. 584,210
Int. Cl. H04l *3/00;* H03k *13/00*
U.S. Cl. 340—347 8 Claims

ABSTRACT OF THE DISCLOSURE

An analog to digital converter in which the input analog signal is compared in a differential amplifier with a feedback analog signal. The amplifier produces an error output of one polarity when the input is greater than the feedback signal and of the other polarity if the feedback exceeds the input. The error output is digitized and fed to a bidirectional counter, causing it to count up or down, depending on the direction of the error. If the error is zero, the total in the counter is transferred to a display or other utilization device. A pulse source feeds pulses to a resettable unidirectional counter and a comparator compares the totals in the two counters. A nonequal comparison results in an output through a gate to a bistable circuit, a switch drive and switching means which produces a rectangular pulse train having variable duty cycle. The pulse train is filtered to produce the feedback analog signal.

This invention relates to electrical converter systems and more particularly to a novel and improved analog voltage to digital converters or the like.

In some respects this invention relates to the copending patent applications of Kenneth A. Huelsman, Ser. No. 422,382 filed Dec. 30, 1964, now U.S. Patent No. 3,327,229, and entitled "Converters"; to copending application of Joe E. Deavenport and Don W. Sexton entitled "Converters," Ser. No. 270,336 filed Apr. 3, 1963, now U.S. Patent No. 3,327,228; and to Patent No. 3,260,943 issued July 12, 1966, to Kenneth A. Huelsman, entitled "Converters." The above related patents describe in more detail some of the component parts of the present invention and therefore little detail will be afforded explanation thereof in this specification for the purpose of eliminating complexity. The aforesaid patent and copending applications are assigned to the assignee of the present invention.

Voltage to digital converters and voltage to frequency converters as described in the aforesaid patents as well as the present invention broadly comprises circuit means for converting an analog input voltage to a digital readout. Such conversion systems are useful when used, for example, in the digital voltmeter art for measuring a desired voltage to find its particular level and displaying this level either in binary or decimal representations. In the prior art some converters such as those previously mentioned depend upon the short term stability of a voltage controlled oscillator for assuring that proper and accurate conversions take place. They also depend to some extent on the absolute stability of a crystal controlled reference which is used in the feedback and counter. The present invention is devised to use a single oscillator whose absolute stability is not needed to achieve accuracy in the system. Thus, the stability of the system is improved. In the prior art devices, the output signal is dependent upon voltage controlled oscillators used therein. Thus, the digital readouts in the form of lamps or the like tend to flicker on the least significant digit because of the instability of the system. Thus ambiguities may occur.

The present invention has a stable decimal display which is completely stationary during the readout time.

Further, the present invention has an advantage over the prior art in that it is capable of being manufactured, for example, by complete integrated circuitries as desired, and also uses fewer components in the device. Such manufacturing techniques are less expensive than other methods and thereby a converter can be devised which is also less expensive. A further advantage of the present invention over prior art devices is that it does not employ the use of signal integration but rather a technique which generates voltages which nullifies feedback. This technique is similar to bridge type null balance machines but it does not require the string of high precision resistors and precision voltage or current switches with their stability problems. It is also similar to the integrating devices explained in the aforesaid copending patent applications and patents but has the high speed characteristics of a bridge device rather than the lower speed associated with the integrating devices.

Briefly described the present invention comprises a first storage means capable of storing a predetermined value which is a sample of the analog voltage input which is desired to be measured; a feedback means capable of continuously feeding back a voltage in relation to the voltage input until such time as a null exists between the voltage input and the sampled feedback voltage occurs; a comparator means which is capable of comparing the feedback means with the predetermined sample of the storage means and indicating when a comparison between the two exists; and gating means which indicates that the comparison exists and that the particular predetermined value in the storage means contains the digital equivalent of the voltage input.

It therefore becomes one object of this invention to provide a novel and improved electrical converter circuit which has a stable output with decreased ambiguity in its readout.

Another object of this invention is to provide a novel and improved electrical converter circuit which is precise on its output yet comparably less expensive.

Another object of this invention is to provide a novel and improved electrical converter circuit which provides discrete output duty cycles in proportion to the analog input.

Another object of this invention is to provide a novel and improved electrical converter which is easier to manufacture and also less expensive because the component parts thereof can be easily manufactured by microminiature circuitry techniques.

In the drawings which illustrate a preferred embodiment of this invention:

FIGURE 3 is a circuit diagram of the error detector used with this invention;

Figure 5:
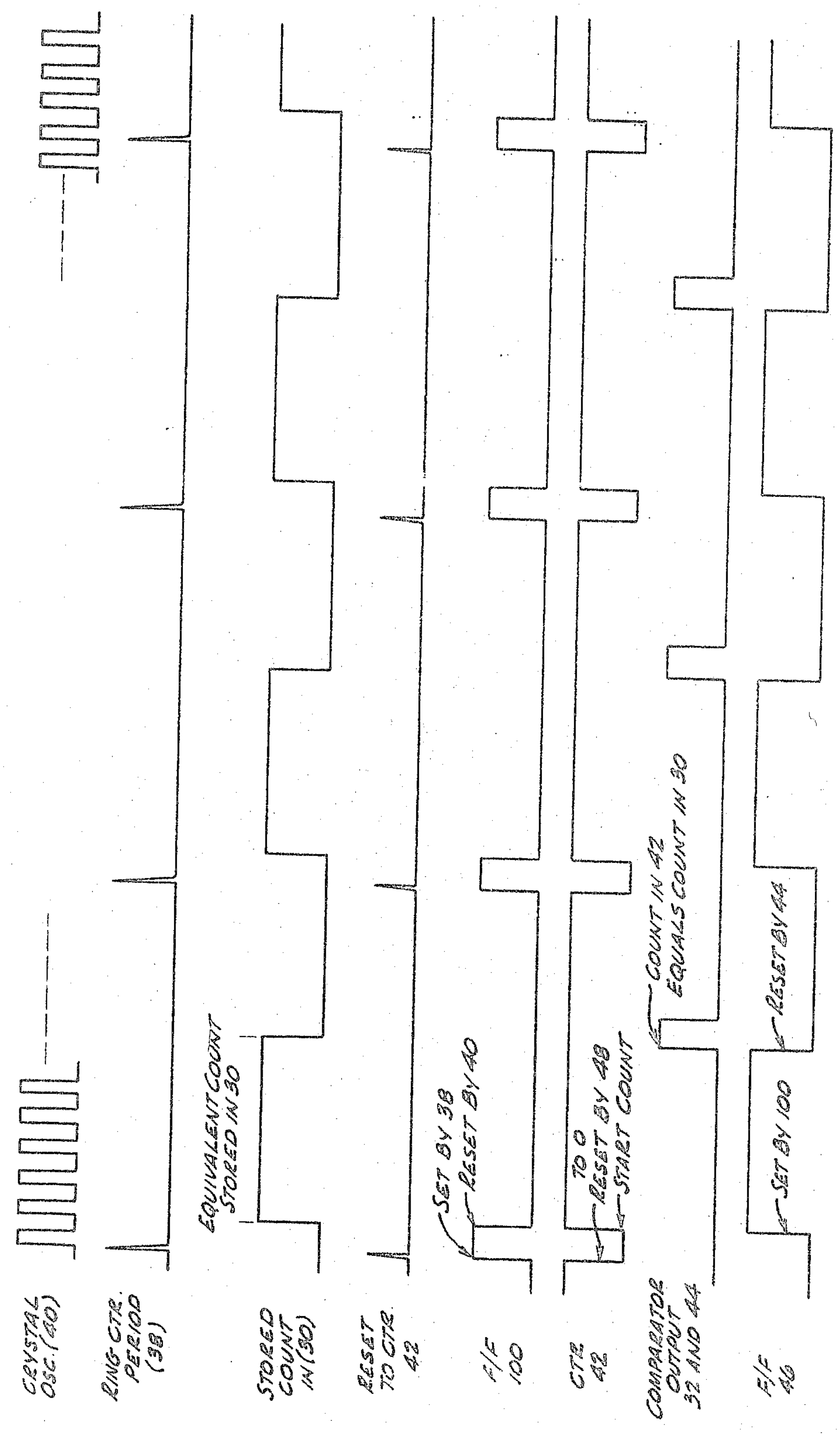

FIGURE 3*a* is a table showing the voltage values in the circuit of FIGURE 3;

FIGURE 4 is a circuit schematic diagram of the circuitry for the up-down error command logic used with this invention; and FIGURE 5 is a representation of the timing in the squarewave generator.

Figure 1:
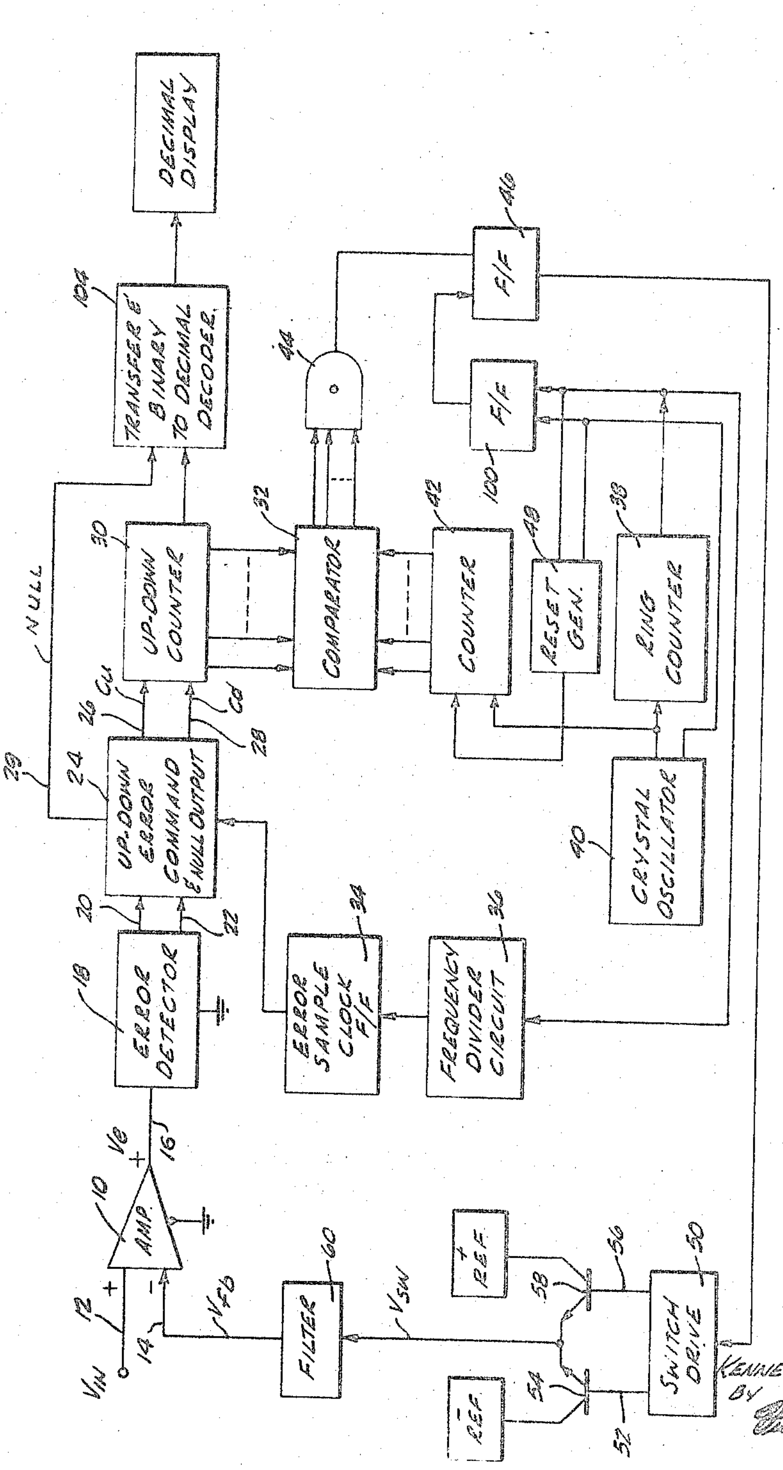
FIGURE 1 is a block diagram illustrating a presently preferred embodiment of this invention.
Figure 2:
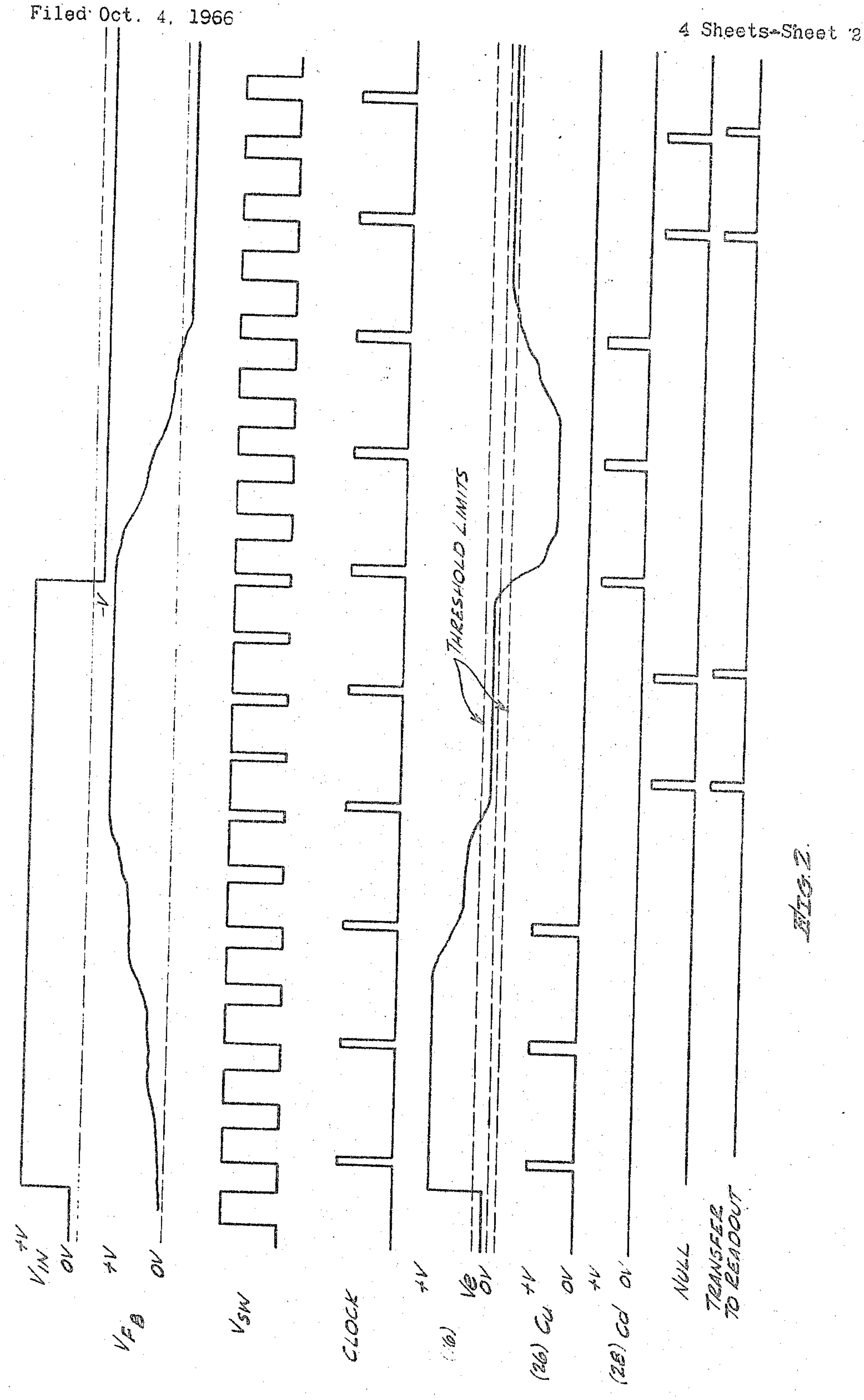
FIGURE 2 is a graph illustrating the timing diagrams of the operational relationship of certain of the components of the circuit arrangements herein.

Turning now to a more detailed description of this invention, there is shown in FIGURE 1 a voltage comparing means in the form of a differential amplifier 10 which has a pair of inputs 12 and 14 and an output 16. The input 12 will receive the voltage input $V_{IN}$ which may be indicative of an analog voltage input and which is desired to be converted to some digital representation thereof. As shown in FIGURE 2 the output 16 of amplifier 10 will provide the output $V_e$ which is coupled directly into an error detector 18 which provides a pair of outputs 20 and 22. Error detector 18 may be, for example, a circuit mean as shown in FIGURE 3 and will be explained later in connection therewith. If $V_e$ is of a positive polarity, for example, output 20 will be energized by error detector 18. If, on the other hand, $V_e$ is of a negative polarity, output circuit 22 of error detector 18 is energized.

Error detector 18 may be, for example, a circuit means as shown in FIGURE 3. A pair of transistors 106 and 108 which may be of the n-p-n type have their emitters coupled through resisting elements to a −5 volt source, V. The collectors of the transistors 106 and 108 are coupled to a +10 volt source through further resistive elements. The base of transistors 108 is coupled to a ground reference and the base of transistor 106 is coupled to lead 16 from amplifier 10. The output of transistor 106 is taken from the collector and is designated $V_A$ and is coupled as the input 22 to the up-down error command 24. The output of transistor 108 is taken from the collector thereof and is designated $V_B$ and is coupled to the input 20 of the up-down error command. If $V_B$ emanating from the amplifier 10 is of a positive polarity, for example, output circuit 20 will be energized by the error detector 18. If, on the other hand, $V_E$ is of a negative plurality output circuit 22 of error detector 18 will be enabled. If $V_E$ is equal to zero which indicates that feedback equals the input then outputs 20 and 22 would have equal voltage applied and half the output for an error as shown in FIGURE 3*a*.

Up-down error command logic 24 is enabled by the output signals 20 and 22 and provides three output signals 26, 28 and 29 which are designated $C_u$, $C_d$ and null, respectively. An example of this circuit for determining error command and null outputs is shown by way of example in FIGURE 4. The output 20 from error detector 18 is coupled to the base of a transistor 110 which may be a n-p-n type which has its collector coupled to a positive voltage source and its emitter coupled to a negative voltage source through a resistor 112. The output lead 22 from error detector 18 is coupled to the base of transistor 114 which may be the n-p-n type and has its collector coupled to a positive voltage source and its emitter coupled through a resistor 116 to a negative voltage source. The output of an error sample clock flip-flop 34 is coupled to the base of transistor 118 which has its collector coupled to a positive voltage source and its emitter coupled to a negative voltage source through a resistor 120. The configuration of the clock input, which includes a differentiating circuit and a limiting diode, provides a spike type pulse which may have a one-volt peak to peak voltage as an example. The outputs of transistors 110 and 114 come from their emitters and are coupled through a pair of diodes 122 and 124 respectively. Diodes 122 and 124 have their cathode electrodes coupled together and to the base of a transistor 126. Transistor 126 may be, for example, a n-p-n type transistor which has its emitter coupled to a negative voltage through a resistor 128. The emitter of transistor 128 also provides the null signal which is coupled into the decoder 104 through lead 29. The collector of transistor 126 is coupled to a positive voltage source. The cathodes of diodes 122 and 124 are coupled through a current resistor 130 to a positive 7.5 volts, for example. The emitters of transistors 110 and 114 are coupled through resistive elements $R_1$ and $R_2$ to the bases of transistors 132 and 134, respectively, which transistors have their collectors coupled to the positive voltage source and their emitters coupled through resistors 136 and 138, respectively, to the negative voltage source. The output of transistor 132 is taken from the emitter and supplies a signal to output lead 26 ($C_u$). The output of transistor 134 emanates from the emitter and supplies a signal to the lead 28 ($C_d$). The bases of transistors 132 and 134 are coupled through diodes $D_1$ and $D_2$ respectively to the +7.5 of voltage source. The output of the clock switching transistor 118 is coupled through capacitors 140, 142 and 144 to the bases of transistors 132, 134 and 126 respectively. Examination of the configuration shown in FIGURE 4 illustrates that if input 20 is +10 volts, for example, then the diode $D_1$ is biased to approximately 2.5 volts and capacitors 140, 142 and 144 may couple in the pulse originating in the sample error clock 34. If input 20 is 5 volts or 1 volt, diode $D_1$ is forward biased and capacitor 140, for example, cannot couple the pulse from the clock 34 to the base of transistor 132. Similar analysis of the input 22 reveals that a +10 volts on that terminal will generate an output pulse at terminal 28. Therefore, if an error exists at output 16 of amplifier 10, then either an up count pulse or a count down pulse will be generated at one of outputs 26 or 28 and if either input 20 or 22 from the error detector 18 is +10 volts, an output from the null will be blocked. If both inputs 20 or 22 are at +5 volts, a null output will be generated.

The output of unit 24 will be referred to as a "digital error signal" because it includes signals in pulse form which contain command information to control the action of reversible counter 30.

An up-down bi-directional type counter 30 can be, for example, a flip-flop counter register which responds to the receipt of up commands $C_u$ by counting in a preferred increasing direction and which responds to the receipt of $C_d$ pulses on input 28 by counting in a decreasing direction. Such a bi-directional counter is well known in the art and is readily available on the commercial market. The outputs of up-down counter 30 are coupled to a comparator 32 which compares the count in counter 30 with that in counter 42 and provides an output to gate circuit 44. The up-down command 24 receives a clock pulse from a clock source 34, as shown in FIGURE 1, which is enabled by a frequency divider circuit 36. Such a frequency divider circuit in its operation will be found and explained in detail in Huelsman, et al., Patent No. 3,260,943, supra, and performs the function of dividing the frequency of the signal provided thereto by a preselected denominator. Frequency divider circuit 36 is enabled by ring counter 38 which is enabled in turn by a crystal oscillator 40. The crystal oscillator 40 is also explained in the Huelsman et al. patent and provides a relatively constant frequency signal to ring counter 38, counter 42, flip-flop circuit 100 and reset generator 48. Ring counter 38 also sets a flip-flop 100 which is in turn reset by the next cycle of crystal oscillator 40. The output of flip-flop 100 is used to set flip-flop 46 to initiate the true, or positive, state of the feedback squarewave. Ring counter 38 is also used to reset counter 42 to zero through reset generator 48. This allows counter 42 to begin a new count at the time flip-flop 46 achieves a true or SET condition. The output of the crystal oscillator is also coupled to the binary decade counter 42. The output of counter 42 is also coupled into comparator 32. If a comparison is made between the counter 42 and the counter 30 and that comparison shows that the counts in the two counters are equal, AND gate 44 will be enabled and trigger a squarewave generator which is in the form of flip-flop 46. Therefore, the true state is determined by the count generated in 42 up to the time of comparison with the count in 30. The false state is then set at this point and reset at the period of ring counter 38. The time relationship of this sequence is shown in FIGURE 5. This diagram does not show the number of counts of the crystal which would actually be generated in an actual device, this being done for clarity.

Switch drive 50 as shown in FIGURE 1 is of the type described in the aforesaid Huelsman et al. patent. The switch drive 50 is triggered by each true state of flip-flop 46. If, for example, output 52 of switch drive 50 is enabled a negative signal is generated at the emitters of the transistor 54 used therewith. When the output path 56 of switch drive 50 is enabled, a positive voltage reference will appear at the emitter output of transistor 58. Thus, the voltage $V_{SW}$ as shown in FIGURE 2 is generated. It will be seen that $V_{SW}$ has a varying duty cycle. The term "duty cycle" as used herein means the ratio or percentage of ON time to OFF time in a signal which is capable of assuming only those two states. A signal which is in the ON state for as long as it is in the OFF state is said to have a duty cycle of 50% or ½. It is implicit in the discussion of duty cycles that the total time occupied by each complete ON-OFF cycle is constant and that only the proportion of time spent in each state changes. The $V_{SW}$ signal is then applied to a filter 60 and the signal $V_{FB}$ as shown in FIGURE 2 is supplied to the input path 14 of amplifier 10. FIGURE 2 shows the relationship around the loop for step function input voltage. The initial input is assumed to be 0 volts and the assumption is made that the squarewave generator is putting out a 50% duty cycle between the equal ± references. The average value of this waveform is the 0 volts and the system would be at null. A +V input is then applied to the input terminal 12. The output 16 of amplifier 10 would immediately go full scale and the error sample clock 34 would generate an up pulse to counter 24 increasing it by one count. The squarewave generator would then generate a series of squarewaves with this new duty cycle which would have more positive dwell and less negative. If the error detector 18 were still not within the threshhold limits then another up count would be sent to counter 24. Again the squarewave generator would generate a still longer positive dwell waveform. This would continue around the loop with the counter 24 being commanded to increase the count a discrete amount each time until a null were detected. This occurs when the duty cycle of the squarewave generator is such that it has an average DC value equal to the incoming voltage. When this occurs and a null is detected and a command is issued to the transfer and binary decoder 104 to transfer the count stored in the up-down counter 24 to the display. It can be seen that the count in 30 will represent the digital representation of the incoming voltage since it sets the duty cycle of the precision squarewave generator and thereby the average DC level fed back to terminal 14 of the input differential amplifier 10. In the details of explanation of the duty cycle used, it can be seen that any linear change in duty cycle will be workable with the present invention. An obvious one is a 50% duty cycle for 0 and say a 10% duty cycle for − full scale and a 90% duty cycle for + full scale. This could be any other duty cycle including an offset from 50% duty cycle for 0. This can be balanced by changing the ± reference supplies to unequal voltages. The accuracy of the device in addition to being determined by the obvious factors such as the stability of the references, the switches and stable resistance in the filter is also affected by the number of cycles of crystal oscillator output used per cycle of squarewave. Study of the FIGURE 5 waveforms will show that the number of cycles needed for a particular resolution will be dependent on the duty cycle range which is chosen. The details of this calculation will be omitted since it is not fundamental to the operation but is only related to a desired accuracy level for a particular system. Also some discussion of this is presented in the aforesaid Patent No. 3,260,943 of Kenneth A. Huelsman et al.

It should also be pointed out that this invention should not be limited to the particular arrangement of the squarewave feedback as shown in FIGURE 1. Comparison of FIGURE 1 with the aforesaid copending applications for voltage to frequency converters will show that the squarewave can be switched between ground and either plus or minus references for a unipolar device and a summation with the opposite polarity reference at terminal 14 would again make it bipolar. Also the feedback would not have to go to terminal 14. Amplifier 10 could be a separate entity and the output of the squarewave generator could be fed back in a manner similar to the one disclosed in Patent No. 3,260,943, as previously mentioned; the output of the integrating amplifier would then go to a null detector instead of a VCO as explained in that patent. These configurations and embodiments are considered to be within the scope of this invention.

Having thus explained one preferred embodiment of this invention what is claimed is:

1. An apparatus for converting an analog signal into a digital signal comprising the combination of means for comparing the input analog signal with a feedback analog signal and for generating digital error signals when the two analog signals are unequal; clock circuit means for controlling the timing of said digital error signals; first counter means for totalling the digital error signals generated; means for internally generating a series of pulses; recycling counter means for counting said series of pulses; means for repetitively comparing the totals in said first counter means and said recycling counter means and for producing variable duty cycle signals, the duty cycles of said signals being representative of the total count accumulated in said first counter means; means for converting said variable duty cycle signals into a slowly varying analog voltage constituting said feedback analog signal; and means for providing the count in said first counter means to a utilization device when said two analog signals are equal.

2. An apparatus according to claim 1 wherein said means for generating variable duty cycle signals comprises a pulse generator, a ring counter, said ring counter having an input enabled by said pulse generator and an output, and a squarewave generator, said squarewave generator being enabled by the output of said comparing means and the output of said ring counter, said squarewave generator having an output path coupled to said means for converting said variable duty cycle signals into a slowly varying analog voltage.

3. Apparatus according to claim 1 wherein said means for internally generating digital signals comprises an oscillator for providing pulses to said second counter means; a reset generator for periodically providing a resetting pulse to said second counter means; and a ring counter for controlling the operation of said reset generator.

4. Apparatus according to claim 1 wherein said means for comparing the input analog signal with the feedback analog signal comprises differential amplifier circuit means for generating a signal of one polarity when the input signal is greater than the feedback signal and of the other polarity when the relative magnitudes are reversed; means for generating a signal on one output terminal when the output of said differential amplifier is positive and on a separate output terminal if the output is negative; and means for periodically generating an "increase count" signal in response to a positive-indicating signal and a "decrease count" signal in response to a negative-indicating signal.

5. Apparatus according to claim 4 wherein said first counter means is a bidirectional counter and said recycling counter means is a unidirectional resettable counter.

6. An apparatus for converting an analog signal into a digital signal comprising the combination of means for comparing the input analog signal with a feedback analog signal and for generating pulse error signals when the two analog signals are unequal; clock circuit means for controlling the timing of said pulse error signals; first counter means for totalling the pulse error signals generated; means for independently generating a series of pulses; second high-speed recycling counter means for repetitively counting said independently generated series of pulses; means for comparing the totals in said first and second counter means and for producing a series of rectangular waveform signals indicative of the count accumulated in said first counter means, each said signal being initiated at the beginning of each cycle of said recycling counter means and terminated when the count in said recycling counter equals the count in said first counter means; means for converting said rectangular waveform signals into a varying-magnitude voltage as said feedback analog signal; and means for connecting the signals produced by said means for comparing the totals in said counter means to a utilization device when said two analog signals are equal.

7. Apparatus according to claim 6 wherein said means for converting the signals produced by said means for comparing the totals in said counter means into analog form comprises first and second reference voltage sources; a filter; switch means for connecting the input of said filter to one of said sources when the analog difference is in one direction and to the other of said sources if the difference is in the other direction; and switch drive means for controlling said switch means in response to said rectangular waveform signals.

8. Apparatus according to claim 6 wherein said means for independently generating digital signals includes means for periodically generating pulses to reset said second counter means to zero.

References Cited

UNITED STATES PATENTS

| | | | |
|---|---|---|---|
| 2,965,891 | 12/1960 | Martin | 340—347 |
| 3,051,939 | 8/1962 | Gilbert | 340—347 |
| 3,075,189 | 1/1963 | Lisicky | 343—7.3 |
| 3,127,601 | 3/1964 | Kaenel | 340—347 |
| 3,201,781 | 8/1965 | Holland | 340—347 |
| 3,228,025 | 1/1966 | Welch | 340—347 |
| 3,267,429 | 8/1966 | Strohmeyer | 340—347 X |
| 3,270,337 | 8/1966 | Howard | 340—347 X |

MAYNARD R. WILBUR, Primary Examiner

GARY R. EDWARDS, Assistant Examiner